(12) United States Patent
Baba et al.

(10) Patent No.: US 11,322,635 B2
(45) Date of Patent: May 3, 2022

(54) LIGHT DETECTION DEVICE

(71) Applicant: HAMAMATSU PHOTONICS K.K., Hamamatsu (JP)

(72) Inventors: Takashi Baba, Hamamatsu (JP); Shunsuke Adachi, Hamamatsu (JP); Shigeyuki Nakamura, Hamamatsu (JP); Terumasa Nagano, Hamamatsu (JP); Koei Yamamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/346,929

(22) PCT Filed: Nov. 9, 2017

(86) PCT No.: PCT/JP2017/040439
§ 371 (c)(1),
(2) Date: May 2, 2019

(87) PCT Pub. No.: WO2018/088479
PCT Pub. Date: May 17, 2018

(65) Prior Publication Data
US 2020/0058821 A1 Feb. 20, 2020

(30) Foreign Application Priority Data
Nov. 11, 2016 (JP) .............................. JP2016-220785

(51) Int. Cl.
*H01L 31/107* (2006.01)
*H01L 27/144* (2006.01)
(Continued)

(52) U.S. Cl.
CPC ........ *H01L 31/107* (2013.01); *H01L 27/1446* (2013.01); *H01L 31/02027* (2013.01); *G01J 2001/4466* (2013.01)

(58) Field of Classification Search
CPC ............... H01L 31/107; H01L 27/1446; H01L 31/02027; G01J 2001/4466
See application file for complete search history.

(56) References Cited

U.S. PATENT DOCUMENTS

2003/0218120 A1* 11/2003 Shibayama ......... H01L 27/1464
250/214.1
2009/0256223 A1 10/2009 Yamamura et al.
(Continued)

FOREIGN PATENT DOCUMENTS

| CN | 1433151 A | 7/2003 |
|---|---|---|
| CN | 102474240 A | 5/2012 |

(Continued)

OTHER PUBLICATIONS

Okada, JP-2014102213-A, Jun. 2014, machine translation.*
(Continued)

*Primary Examiner* — Peter Bradford
(74) *Attorney, Agent, or Firm* — Faegre Drinker Biddle & Reath LLP (57) ABSTRACT

A photodetecting device includes a semiconductor substrate including a one-dimensionally distributed plurality of pixels. The photodetecting device includes, for each pixel, a plurality of avalanche photodiodes arranged to operate in Geiger mode, a plurality of quenching resistors electrically connected in series with the respective avalanche photodiodes, and a signal processing unit arranged to process output signals from the plurality of avalanche photodiodes. Light receiving regions of the plurality of avalanche photodiodes are two-dimensionally distributed for each pixel. Each signal processing unit includes a gate grounded circuit and a current mirror circuit electrically connected to the gate grounded circuit. The gate grounded circuit is electrically connected to the plurality of avalanche photodiodes of the corresponding pixel via the plurality of quenching resistors.

(Continued)

The current minor circuit is arranged to output a signal corresponding to output signals from the plurality of avalanche photodiodes.

5 Claims, 9 Drawing Sheets

(51) Int. Cl.
*H01L 31/02* (2006.01)
*G01J 1/44* (2006.01)

(56) References Cited

U.S. PATENT DOCUMENTS

| | | | |
|---|---|---|---|
| 2011/0237952 A1* | 9/2011 | Ooishi | G01S 15/8925 |
| | | | 600/459 |
| 2012/0098574 A1 | 4/2012 | Morikawa | |
| 2012/0267746 A1 | 10/2012 | Sanfilippo et al. | |
| 2013/0108261 A1 | 5/2013 | Jiang et al. | |
| 2013/0141168 A1 | 6/2013 | Nozaki et al. | |
| 2014/0263946 A1 | 9/2014 | Nguyen et al. | |
| 2016/0060102 A1* | 3/2016 | Yang | H01L 27/092 |
| | | | 257/252 |
| 2016/0276399 A1* | 9/2016 | Atsuta | H01L 27/14636 |
| 2016/0329455 A1 | 11/2016 | Nagano et al. | |
| 2017/0205516 A1* | 7/2017 | Yamakawa | H01L 31/0203 |

FOREIGN PATENT DOCUMENTS

| | | |
|---|---|---|
| CN | 105609583 A | 5/2016 |
| JP | 2011-7693 A | 1/2011 |
| JP | 2013-093872 A | 5/2013 |
| JP | 2013-247289 A | 12/2013 |
| JP | 2014-102213 A | 6/2014 |
| JP | 2015-49256 A | 3/2015 |
| JP | 2016-80442 A | 5/2016 |
| JP | 2016-174048 A | 9/2016 |
| WO | WO 2016/060102 A1 | 4/2016 |

OTHER PUBLICATIONS

Chang, Po-Hsuan et al., "Constant Excess Bias Control for Single-Photon Avalanche Diode Using Real-Time Breakdown Monitoring," IEEE Electron Device Letters, Aug. 2015, vol. 36, No. 8, pp. 859-861.
International Preliminary Report on Patentability dated May 23, 2019 for PCT/JP2017/040439.

* cited by examiner

LIGHT DETECTION DEVICE

TECHNICAL FIELD

The present invention relates to a photodetecting device.

BACKGROUND ART

Known photodetecting devices include a semiconductor substrate having a first principal surface and a second principal surface that oppose each other and arranged with a single pixel (for example, see Patent Literature 1). The photodetecting device includes a plurality of avalanche photodiodes arranged to operate in Geiger mode, a plurality of quenching resistors electrically connected in series with the respective avalanche photodiodes, and a signal processing unit arranged to process output signals from the plurality of avalanche photodiodes. Each of the plurality of avalanche photodiodes includes a light receiving region provided in the first principal surface side of the semiconductor substrate. The plurality of quenching resistors are provided on the first principal surface side of the semiconductor substrate. The light receiving regions of the plurality of avalanche photodiodes are two-dimensionally distributed.

CITATION LIST

Patent Literature

Patent Literature 1: Japanese Unexamined Patent Publication No. 2011-007693

SUMMARY OF INVENTION

Technical Problem

The object of an aspect of the present invention is to provide a photodetecting device including a one-dimensionally distributed plurality of pixels and arranged to detect weak light with high accuracy and low power consumptions.

Solution to Problem

As a result of researches and studies, the present inventors newly found the following facts.

When each avalanche photodiode is electrically connected directly to a subsequent-stage circuit of a photodetecting device, an output pulse of the photodetecting device deteriorates due to a passive component of the subsequent-stage circuit. Therefore, a signal processing unit (front end circuit) including an operational amplifier circuit is electrically connected to a preceding stage of the subsequent-stage circuit. A signal from each avalanche photodiode is output to the subsequent stage circuit via the signal processing unit that is the front end circuit. In which case, although a pulse waveform of an output signal from each avalanche photodiode is transmitted to the subsequent-stage circuit.

If the front end circuit includes an operational amplifier circuit, the following problems may occur. When the response speed of the operational amplifier circuit is slow, it is more difficult to accurately transmit a waveform of a pulse signal received by the operational amplifier circuit, and more particularly, it is more difficult to accurately transmit a steepness of a rise of the pulse signal to the subsequent-stage circuit, as compared with when the response speed of the operational amplifier circuit is fast. In order to increase a response speed of the operational amplifier circuit, inevitably the gain of the operational amplifier circuit is reduced or the power supply increased.

If the gain of the operational amplifier circuit is low, a pulse peak value of the output signal from the photodetecting device may decrease, and detection accuracy of weak light may deteriorate. Therefore, in order to set the gain and the response speed of the operational amplifier circuit to desired values, the power supplied to the operational amplifier circuit is increased. When the power supplied to the operational amplifier circuit is high, the power consumption of the operational amplifier circuit is also high. When the photodetecting device includes a one-dimensionally distributed plurality of pixels, and the operational amplifier circuit is electrically connected for each pixel, a power consumption of the entire device is enormous.

The inventors of the present application have found a photodetecting device with the following configuration. For each pixel, the photodetecting device includes a plurality of avalanche photodiodes arranged to operate in Geiger mode and a signal processing unit arranged to process output signals from the plurality of avalanche photodiodes. Each signal processing unit includes a gate grounded circuit electrically connected to the respective plurality of avalanche photodiodes and a current mirror circuit electrically connected to the gate grounded circuit.

In general, an input impedance of the gate grounded circuit is lower than an input impedance of a read circuit other than the gate grounded circuit. Therefore, the gate grounded circuit accurately transmits a steepness of a rise of the output signal from each avalanche photodiode arranged to operate in Geiger mode to the current mirror circuit. The current mirror circuit has low power consumption, has a high response speed, and accurately transmits information about the input signal, as compared with the operational amplifier circuit. The information about the input signal includes, for example, signal waveforms.

Each signal processing unit including the gate grounded circuit and the current mirror circuit more accurately transmits the steepness of the rise of the output signal from the avalanche photodiode with low power consumption. Therefore, the photodetecting device found by the inventors of the present application includes a one-dimensionally distributed plurality of pixels, and detects weak light with high accuracy and with low power consumption.

An aspect of the present invention is a photodetecting device including a semiconductor substrate having a first principal surface and a second principal surface opposing each other and including a one-dimensionally distributed plurality of pixels. For each pixel, the photodetecting device includes a plurality of avalanche photodiodes arranged to operate in Geiger mode, a plurality of quenching resistors, and a signal processing unit. Each of the plurality of avalanche photodiodes includes a light receiving region provided in the first principal surface side of the semiconductor substrate. The plurality of quenching resistors are provided on the first principal surface side of the semiconductor substrate and electrically connected in series with the corresponding avalanche photodiode. The signal processing unit is arranged to process output signals from the plurality of avalanche photodiodes. The light receiving regions of the plurality of avalanche photodiodes are two-dimensionally distributed for each pixel. Each signal processing unit includes a gate grounded circuit and a current mirror circuit. The gate grounded circuit is electrically connected to the plurality of avalanche photodiodes of the corresponding pixel via the plurality of quenching resistors. The current mirror circuit is electrically connected to a corresponding gate grounded circuit, and is arranged to output a signal corresponding to the output signals from the plurality of avalanche photodiodes.

In the photodetecting device according to this aspect, each signal processing unit includes the gate grounded circuit and the current mirror circuit. Therefore, each signal processing unit accurately transmits a steepness of a rise of the output signal from the avalanche photodiode with low power consumption. Therefore, in the photodetecting device according to the aspect, the one-dimensionally distributed plurality of pixels detect weak light with high accuracy and with low power consumption.

In the photodetecting device according to the aspect, each signal processing unit may include a comparator receiving an output signal from the current mirror circuit. In which case, a signal having a desired pulse wave height is detected from the signals input into the comparator.

The photodetecting device according to the aspect may have a circuit board separated from the semiconductor substrate. The signal processing unit may be arranged on the circuit board. When the semiconductor substrate and the circuit board are separated, the semiconductor substrate and the circuit board can be manufactured according to processes suitable therefor. Therefore, both improvement of characteristics and yield of each substrate are achieved.

The photodetecting device according to the aspect may have a semiconductor photodetecting element having a semiconductor substrate. The semiconductor photodetecting element may be mounted on the circuit board such that the second principal surface and the circuit board oppose each other, and may include a through-electrode penetrating through the semiconductor substrate in a thickness direction for each of the pixels. The through-electrode may be electrically connected to the respective plurality of quenching resistors. The gate grounded circuit of each of the signal processing units may be electrically connected to the plurality of avalanche photodiodes via a corresponding through-electrode. In which case, the plurality of avalanche photodiodes are electrically connected to the signal processing unit provided on the mount substrate via the through-electrode. This embodiment achieves a low parasitic inductance, a low parasitic capacitance, and a high responsivity, as compared with a configuration in which a plurality of avalanche photodiodes are electrically connected to a signal processing unit via a bonding wire.

Advantageous Effects of Invention

An aspect of the present invention provides a photodetecting device including a one-dimensionally distributed plurality of pixels and arranged to detect weak light with high accuracy and with low power consumption.

DESCRIPTION OF EMBODIMENTS

Embodiments of the present invention will be hereinafter described in detail with reference to the accompanying drawings. In the description, the same reference numerals are used for the same elements or elements having the same functions, and redundant descriptions thereabout are omitted.

Figure 1:
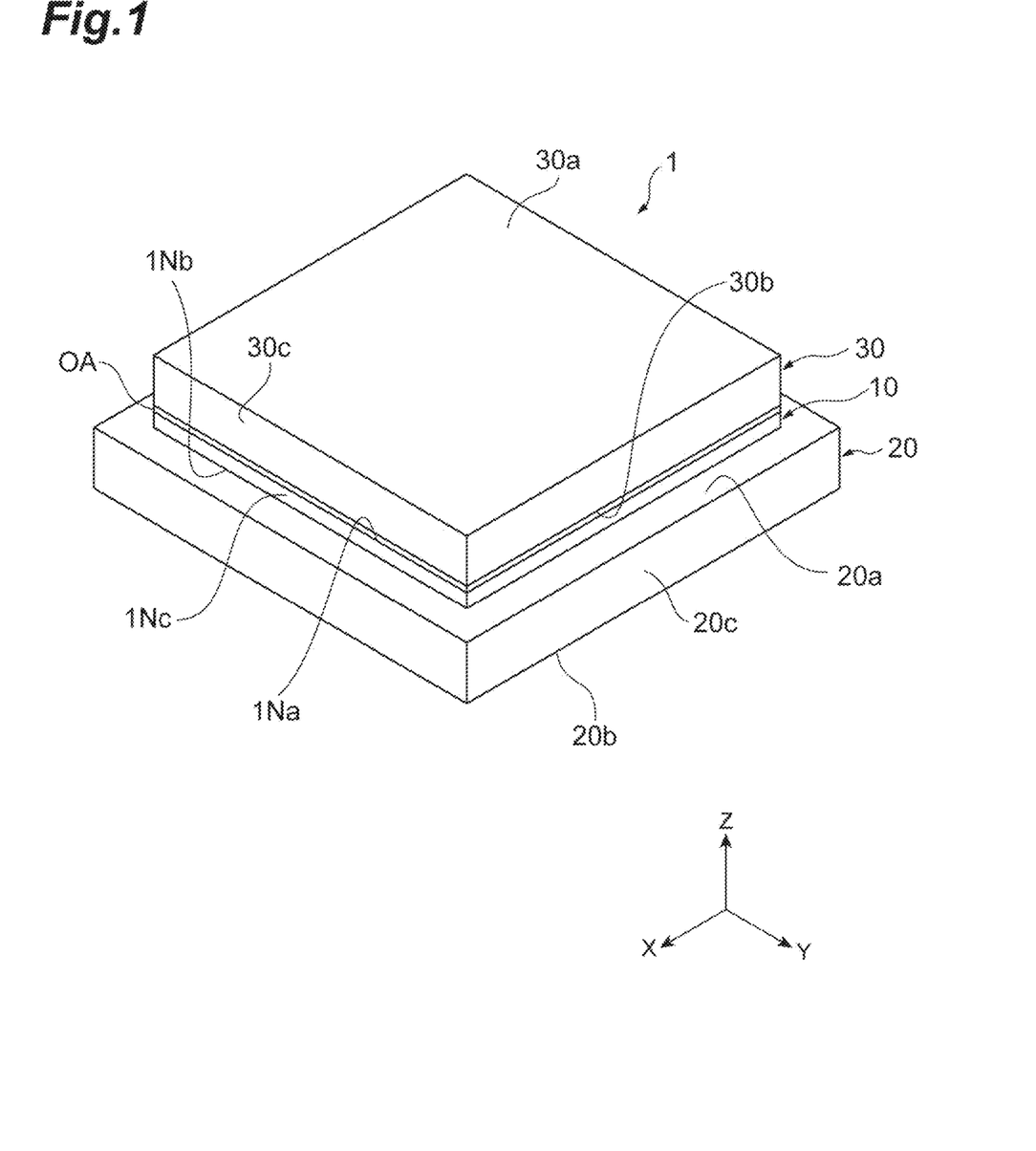
FIG. 1 is a schematic perspective view illustrating a photodetecting device according to one embodiment.
Figure 2:
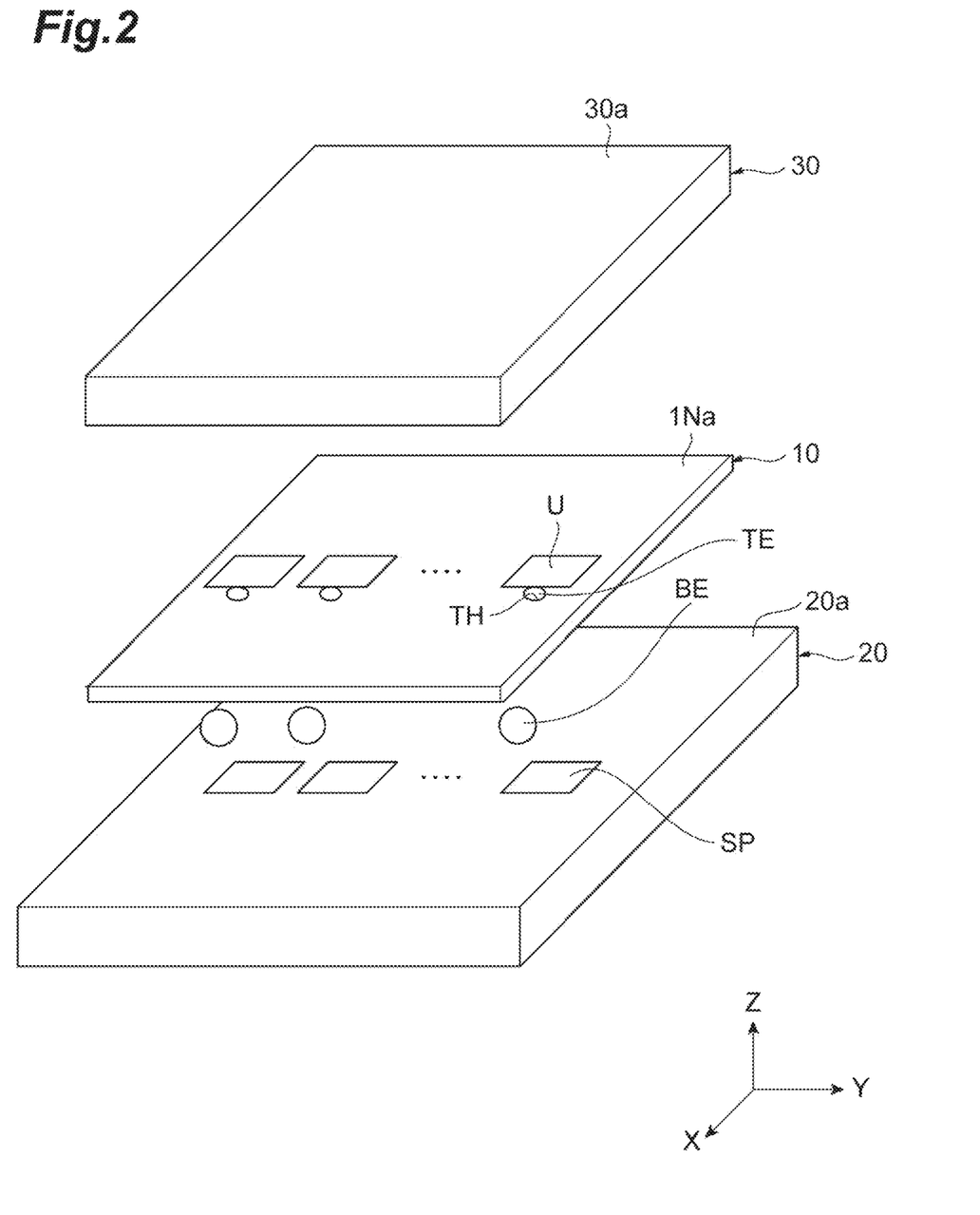
FIG. 2 is an exploded perspective view of the photodetecting device.

First, a configuration of a photodetecting device according to the present embodiment will be described with reference to FIG. 1 and FIG. 2. FIG. 1 is a schematic perspective view illustrating a photodetecting device according to the present embodiment. FIG. 2 is an exploded perspective view of the photodetecting device illustrated in FIG. 1.

As illustrated in FIG. 1 and FIG. 2, the photodetecting device 1 includes a semiconductor photodetecting element 10, a mount substrate 20, and a glass substrate 30. The mount substrate 20 opposes the semiconductor photodetecting element 10. The glass substrate 30 opposes the semiconductor photodetecting element 10. The semiconductor photodetecting element 10 is disposed between the mount substrate 20 and the glass substrate 30. In the present embodiment, a plane in parallel with each principal surface of the semiconductor photodetecting element 10, the mount substrate 20, and the glass substrate 30 is XY-axis plane, and a direction perpendicular to each principal surface is Z-axis direction.

The semiconductor photodetecting element 10 includes a semiconductor substrate 50 having a rectangular shape in a plan view. The semiconductor substrate 50 is made of Si and is an N type semiconductor substrate. The semiconductor substrate 50 includes a principal surface 1Na and a principal surface 1Nb that oppose each other. The N type is an example of a first conductivity type. An example of a second conductivity type is a P type.

As shown in FIG. 2, the semiconductor photodetecting element 10 includes a plurality of pixels U and a plurality of through-electrodes TE. The plurality of pixels U are one-dimensionally distributed in the semiconductor substrate 50 in the Y axis direction. Along the row of the plurality of pixels U, the plurality of through-electrodes TE are one-dimensionally distributed on the semiconductor substrate 50 in the Y axis direction. The photodetecting device 1 outputs signals corresponding to the light detected by the plurality of pixels U. In the present embodiment, the number of pixels U is 8 to 32. A pitch WU between the pixels U is 10 to 500 μm.

The glass substrate 30 includes a principal surface 30a and a principal surface 30b that oppose each other. The glass substrate 30 has a rectangular shape in a plan view. The principal surface 30b opposes the principal surface 1Na of the semiconductor substrate 50. The principal surface 30a and the principal surface 30b are flat. The glass substrate 30 and the semiconductor photodetecting element 10 are optically connected by an optical adhesive OA. The glass substrate 30 may be formed directly on the semiconductor photodetecting element 10A.

The mount substrate 20 includes a principal surface 20a and a principal surface 20b that oppose each other. The mount substrate 20 has a rectangular shape in a plan view. The semiconductor photodetecting element 10 is mounted on the mount substrate 20. The principal surface 20a opposes the principal surface 1Nb.

The mount substrate 20 constitutes an ASIC (Application Specific Integrated Circuit). As illustrated in FIG. 2, the mount substrate 20 includes a plurality of signal processing units SP. The plurality of signal processing units SP are one-dimensionally distributed in the principal surface 20a side of the mount substrate 20. Each signal processing unit SP includes an electrode arranged corresponding to the through-electrode TE. Each electrode is electrically connected to a corresponding through-electrode TE through a bump electrode BE.

The side surfaces 20c of the mount substrate 20 are located outside, in the XY-axis plane direction, of the side surfaces 1Nc of the semiconductor substrate 50 and the side surfaces 30c of the glass substrate 30. That is, in the plan view, the area of the mount substrate 20 is larger than the area of each of the semiconductor substrate 50A and the glass substrate 30. The side surfaces 1Nc of the semiconductor substrate 50, the side surfaces 30c of the glass substrate 30, and the side surfaces 20c of the mount substrate 20 may be flush with each other. In which case, in the plan view, the outer edges of the semiconductor substrate 50, the outer edges of the glass substrate 30, and the outer edges of the mount substrate 20 match each other.

Figure 3:
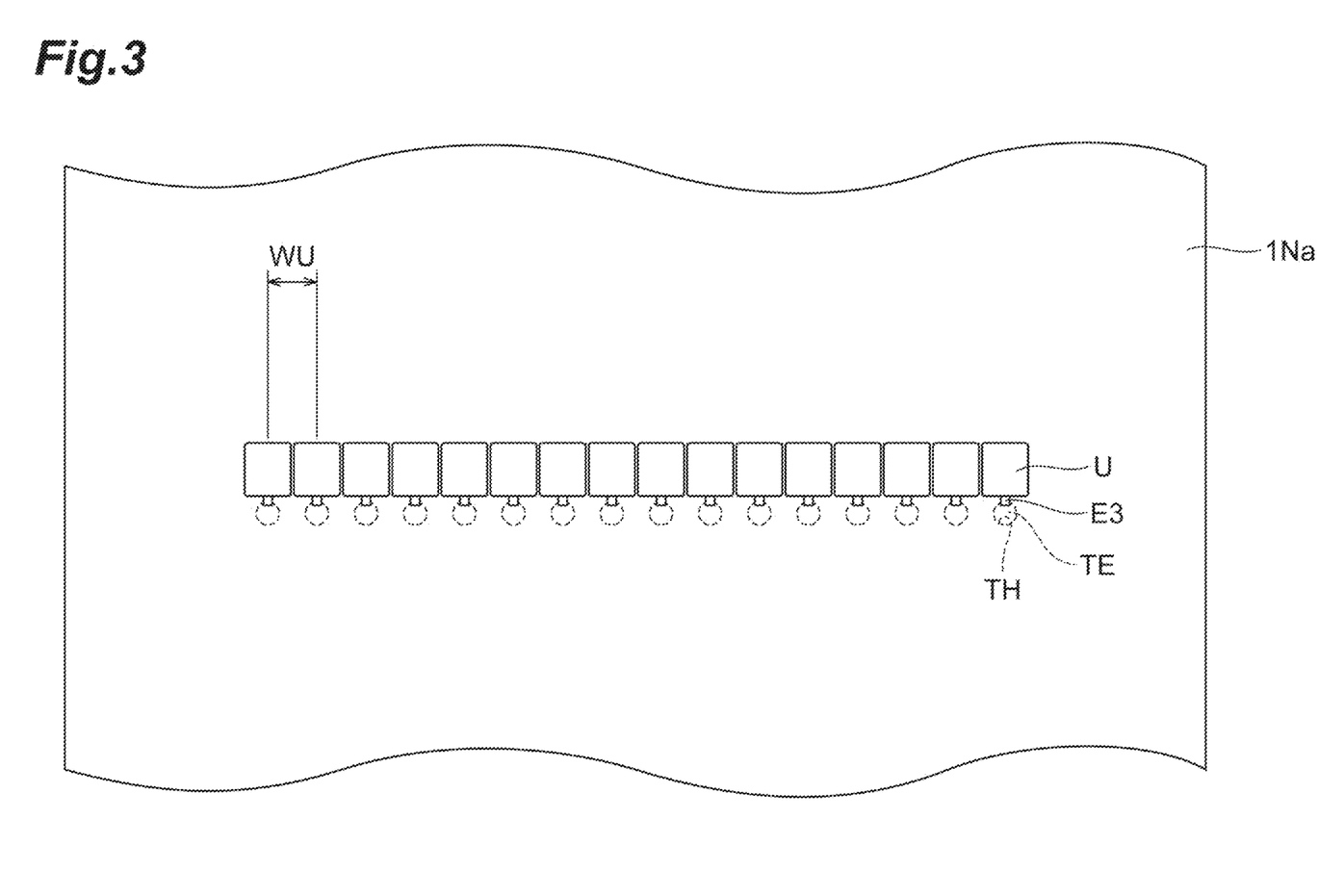
FIG. 3 is a schematic plan view illustrating a semiconductor photodetecting element.
Figure 4:
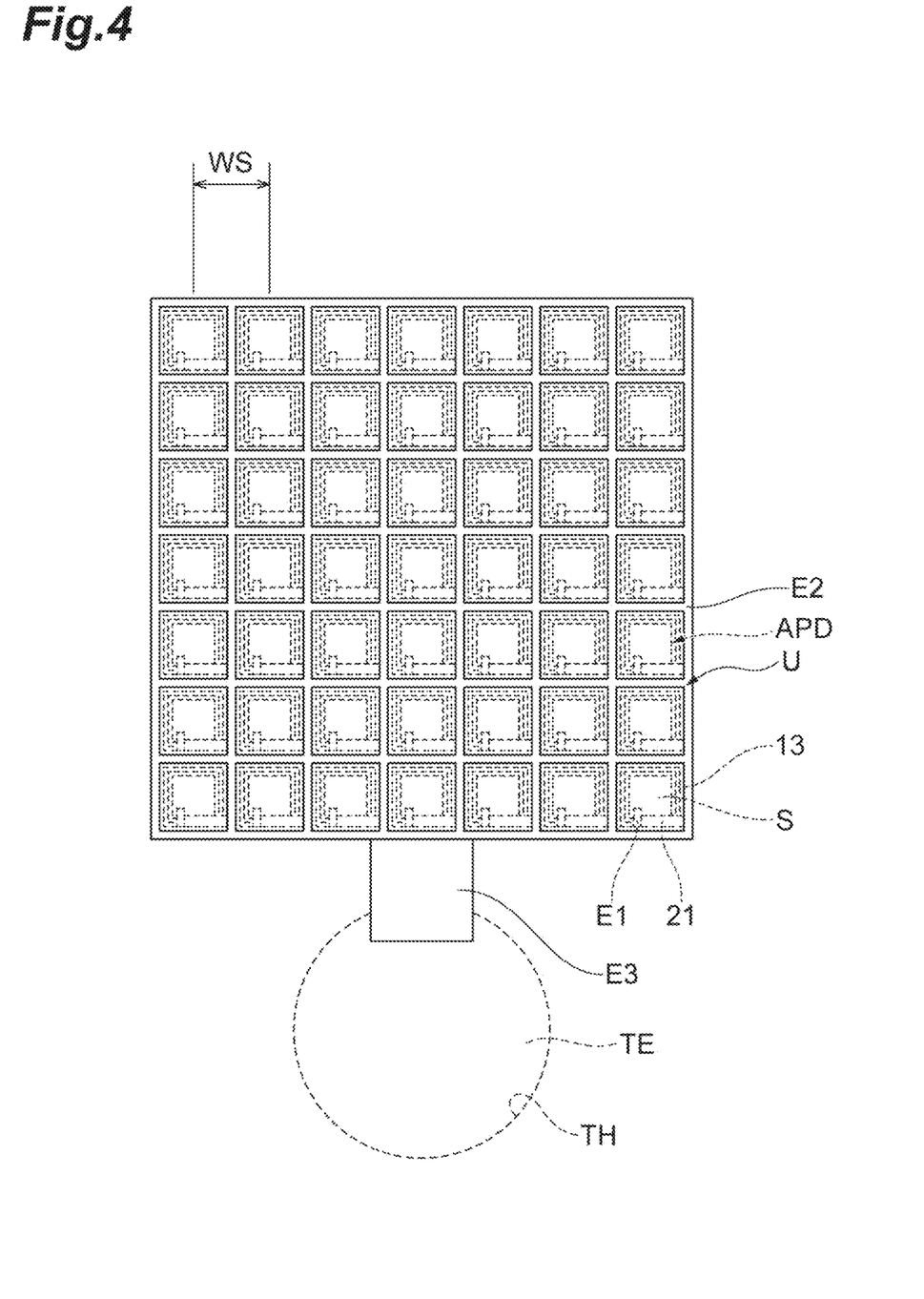
FIG. 4 is a schematic enlarged view illustrating a semiconductor photodetecting element.

Next, a configuration of the semiconductor photodetecting element 10 will be described with reference to FIG. 3 and FIG. 4. FIG. 3 is a view of the semiconductor photodetecting element 10 as seen from the direction (Z axis direction) orthogonal to the principal surface 1Na. In FIG. 3, the insulation layer L4 (see FIG. 6) is not illustrated. FIG. 4 illustrates one pixel U and the vicinity of the pixel U.

For every pixel U, the semiconductor photodetecting element 10 includes a plurality of avalanche photodiodes APD arranged to operate in Geiger mode, a plurality of quenching resistors 21, and a through-electrode TE. The through-electrode TE penetrates through the semiconductor substrate 50 in the thickness direction (Z axis direction).

The plurality of avalanche photodiodes APD are two-dimensionally distributed in the semiconductor substrate 50. Each avalanche photodiode APD includes a light receiving region S. The light receiving region S is provided in the principal surface 1Na side of the semiconductor substrate 50. As illustrated in FIG. 4, in the semiconductor photodetecting element 10, each pixel U includes a plurality of light receiving regions S. The plurality of light receiving regions S are two-dimensionally distributed in each pixel U. A pitch WS of the light receiving region S in one pixel U is 10 to 50 µm in the row direction and the column direction. The light receiving region Si is a charge generating region (a photosensitive region) configured to generate charges in response to incident light. That is, the light receiving region S1 is a photodetecting region.

As illustrated in FIG. 4, each light receiving region S has a rectangular shape when viewed from the Z axis direction. In the semiconductor substrate 50, a trench 13 is formed to surround the entire circumference of each light receiving region S when viewed from the Z axis direction. Like the light receiving region S, the area surrounded by the trench 13 has a rectangular shape when viewed from the Z axis direction.

For each pixel U, the semiconductor photodetecting element 10 includes a plurality of electrodes E1, an electrode E2, and an electrode E3. Each of the electrodes E1 is connected to a corresponding light receiving region S. The electrodes E1 are each disposed on the principal surface 1Na of the semiconductor substrate 50 and extends outside of a light receiving region S. The electrodes E1 are each connected to a quenching resistor 21. The electrodes E1 each connect a light receiving region S and a quenching resistor 21 that correspond to each other. Each electrode E1 has an end connected to the light receiving region S and an end connected to a quenching resistor 21.

The quenching resistors 21 constitute passive quenching circuits. Each of the quenching resistors 21 is arranged on the principal surface 1Na of the semiconductor substrate 50. Each quenching resistor 21 is electrically connected in series with the light receiving region S of the corresponding avalanche photodiode APD through the electrode E1. The quenching resistor 21 extends along the outer edge of the light receiving region S. The quenching resistor 21 is connected to the electrode E1 and the electrode E2. The quenching resistor 21 has an end connected to the electrode E1 and an end connected to the electrode E2.

The electrode E2 is arranged in a lattice pattern to pass between the plurality of light receiving regions S included in one pixel U when viewed from the Z axis direction. The light receiving region S and the trench 13 is surrounded by the electrode E2 when viewed from the Z axis direction. The electrode E2 is electrically connected to all the light receiving regions S included in one pixel U through the electrodes E1 and the quenching resistors 21. The electrode E2 is connected to the electrode E3.

The electrode E3 extends from the electrode E2 and is electrically connected to the corresponding through-electrode TE. All the quenching resistors 21 included in one pixel U are electrically connected in parallel to one through-electrode TE by the electrode E2 and the electrode E3.

When viewed from the Z axis direction, the plurality of through-electrodes TE are arranged along an area where the plurality of pixels U are one-dimensionally distributed. Each through-electrode TE is electrically connected to a single corresponding pixel U. Each through-electrode TE is connected to the plurality of avalanche photodiodes APD (the plurality of light receiving regions S) included in the corresponding pixel U through the electrode E1, the quenching resistor 21, the electrode E2, and the electrode E3.

Figure 5:
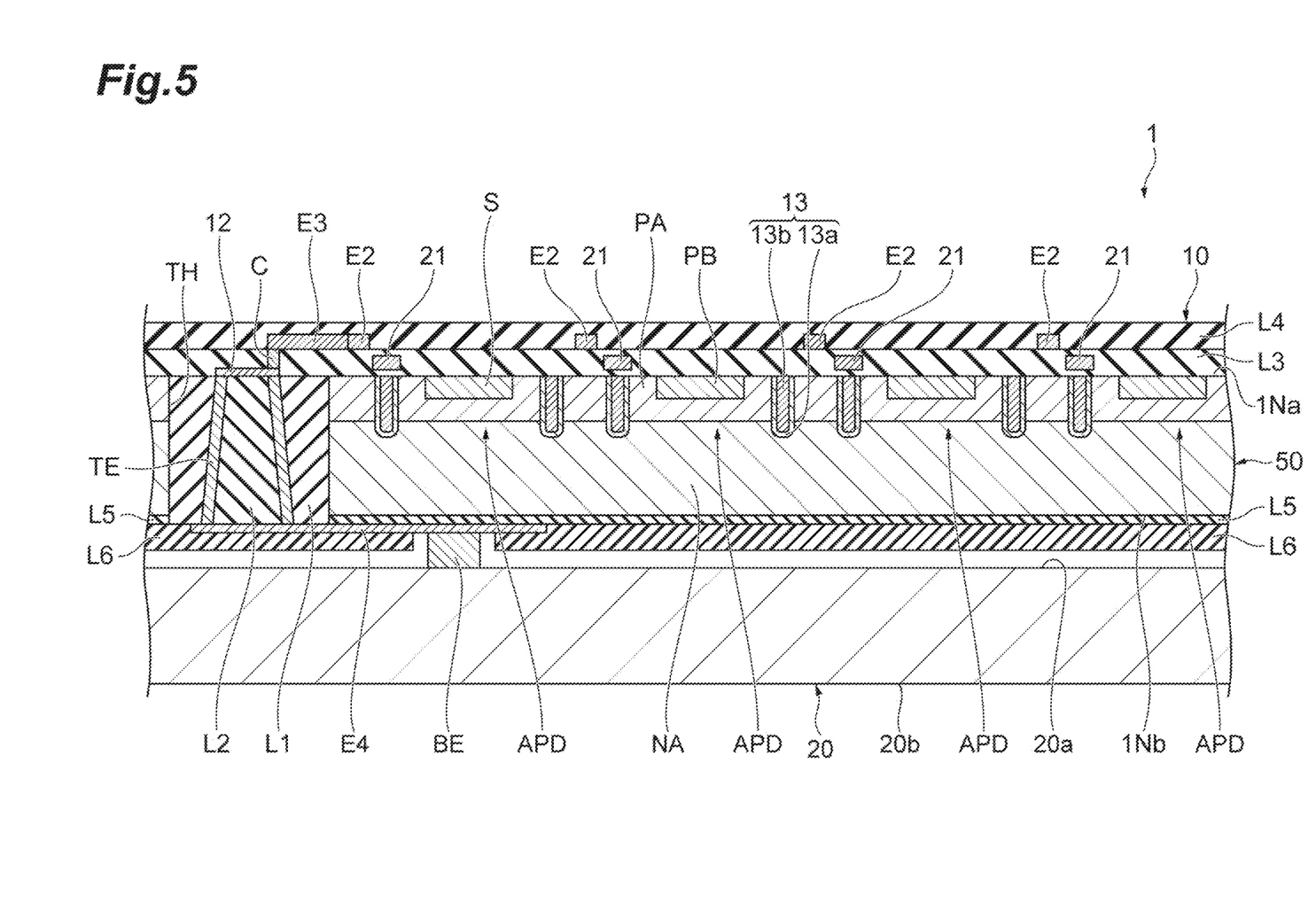
FIG. 5 is a diagram illustrating a cross-sectional configuration of the semiconductor photodetecting element.

Next, with reference to FIG. 5, the configuration of the semiconductor photodetecting element 10 according to the present embodiment will be described. FIG. 5 illustrates a sectional configuration of the semiconductor photodetecting element 10 and the mount substrate 20.

Each of the avalanche photodiodes APD includes a P-type first semiconductor region PA, an N-type second semiconductor region NA, and a P-type third semiconductor region PB. The first semiconductor region PA is located at the principal surface 1Na side of the semiconductor substrate 50. The second semiconductor region NA is located at the principal surface 1Nb side of the semiconductor substrate 50. The third semiconductor region PB is formed in the first semiconductor region PA. An impurity concentration of the third semiconductor region PB is higher than an impurity concentration of the first semiconductor region PA. The third semiconductor region PB is the light receiving region S. Each of the avalanche photodiodes APD is configured to include a P+ layer serving as the third semiconductor region PB, a P layer serving as the first semiconductor region PA, and an N+ layer serving as the second semiconductor region NA, which are arranged in this order from the principal surface 1Na.

In the semiconductor substrate 50, a trench 13 is formed to surround the third semiconductor area PB. As illustrated in FIG. 5, the trench 13 penetrates through the first semiconductor area PA in the Z axis direction and reaches the second semiconductor area NA. An insulation layer 13a and a core material 13b are arranged on the trench 13. The core material 13b is made of metal with a high melting point. The core material 13b is made of, for example, tungsten.

The semiconductor photodetecting element 10 includes an electrode pad 12 and an electrode E4 for each pixel U. The electrode pad 12 is located on the principal surface 1Na, and the electrode E4 is located on the principal surface 1Nb. The electrode pad 12 and the electrode E4 are arranged to correspond to the through-electrode TE. The electrode pad 12 is electrically connected to the electrode E3 through a connection unit C. The electrode pad 12 electrically connects the electrode E3 and the through-electrode TE.

The through-electrode TE, is disposed in a through-hole TH penetrating through the semiconductor substrate 50 in the thickness direction (Z axis direction). The insulation layer L1, the through-electrode TE, and the insulation layer L2 are arranged in the through-hole TH. The insulation layer L1 is formed on the inner peripheral surface of the through-hole TH. The through-electrode TE is disposed in the through-hole TH with the insulation layer L1 interposed therebetween. The insulation layer L2 is arranged in a space formed inside of the through-electrode TE. In the present embodiment, the through-electrode TE has a tubular shape. The members disposed in the through-hole TH are arranged from the inner peripheral surface side of the through-hole TH in the following order: the insulation layer L1, the through-electrode TE, and the insulation layer L2.

An insulation layer L3 is arranged on the first semiconductor area PA, the second semiconductor area NA, the third semiconductor area PB, and the trench 13. The quenching resistor 21 and the electrode pad 12 are covered with the insulation layer L3. The electrodes E2 and E3 are arranged on the insulation layer L3 and covered with the insulation layer L4.

The electrode E4 is arranged on the principal surface 1Nb with an insulation layer L5 interposed therebetween. The electrode E4 has an end connected to the through-electrode TE and an end connected to the bump electrode BE. The electrode E4 connects the through-electrode TE and the bump electrode BE. The electrode E4 is covered with an insulation layer L6 except for the area connected to the bump electrode BE.

The electrodes E1, E2, E3, and E4, the electrode pad 12, and the through-electrode TE are made of metal. The electrodes E1, E2, E3, and E4, the electrode pad 12, and the through-electrode TE are made of, for example, aluminum (Al). When the semiconductor substrate is made of Si, copper (Cu) is used as an electrode material instead of aluminum. The electrodes E1, E2, E3, and E4, the electrode pad 12, and the through-electrode TE may be integrally formed. The electrodes E1, E2, E3, and E4, the electrode pad 12, and the through-electrode TE are formed, for example, by sputtering.

When Si is used for the material of the semiconductor substrate 50, a Group-III element (for example, B) is used for P-type impurity and a Group-V element (for example, P or As) is used for N-type impurity. An element whose N-type and P-type, which are the conductivity-types of the semiconductor, are replaced with each other also functions as a semiconductor photodetecting element, like the semiconductor photodetecting element 10. For example, a diffusion method or an ion implantation method is used for the adding method of the impurity.

The insulating layers L1, L2, L3, L4, L5, L6, and 13a are made of, for example, $SiO_2$, SiN, or resin. For example, a thermal oxidation method, a sputtering method, a CVD method, or a resin coating method is used for forming the insulating layers L1, L2, L3, L4, L5, L6, and 13a.

The mount substrate 20 is electrically connected to the through-electrode TE with the bump electrode BE. The signal output from each avalanche photodiode APD is led to the mount substrate 20 through the electrode E1, the quenching resistor 21, the electrode E2, the electrode E3, the electrode pad 12, the through-electrode TE, the electrode E4, and the bump electrode BE.

The bump electrode BE is formed on the electrode E4 with an under bump metal (UBM), not illustrated, interposed therebetween. The UBM is made of a material with excellent electrical and physical connection with the bump electrode BE. The UBM is formed by, for example, an electroless plating method. The bump electrode BE is formed by, for example, a method of mounting a solder ball, a printing method, or an electroplating method. The bump electrode BE is made of, for example, solder or indium.

Figure 6:
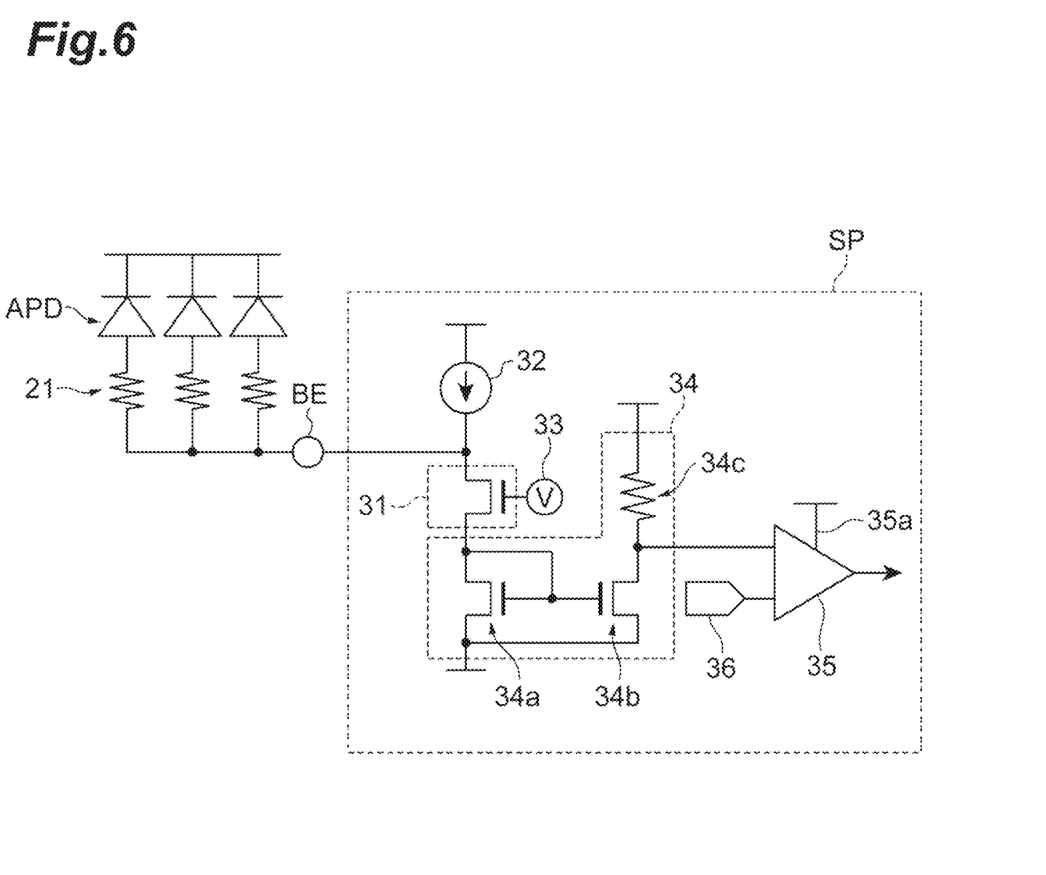
FIG. 6 is a circuit diagram illustrating a photodetecting device.

Next, the configuration of the mount substrate according to the present embodiment will be described with reference to FIG. 2 and FIG. 6. FIG. 6 illustrates the circuit configuration of photodetecting device 1.

As illustrated in FIG. 2, the mount substrate 20 includes a plurality of signal processing units SP. The plurality of signal processing units SP are one-dimensionally distributed on the principal surface 20a side of the mount substrate 20 in the Y axis direction. The signal processing unit SP is a front-end circuit arranged to process the signal from the corresponding avalanche photodiode APD before outputting the signal to a subsequent-stage circuit connected to the photodetecting device 1.

In the subsequent-stage circuit, the output pulse of the photodetecting device 1 may degrade due to a passive component of the subsequent-stage circuit. The signal processing unit SP is configured to transmit the pulse waveform of the output signal from each avalanche photodiode APD to the subsequent stage circuit. The signal processing unit SP has a low impedance and a high frequency response. The signal processing unit SP transmits a high-speed rise of the output signal of each avalanche photodiode APD to the subsequent stage circuit. Therefore, degradation of the output pulse of photodetecting device 1 is suppressed.

The signal processing unit SP includes an input end electrically connected to the bump electrode BE. Each signal processing unit SP is arranged to receive output signals from the plurality of avalanche photodiodes APD of the corresponding pixel U through the quenching resistor 21, the through-electrode TE, and the bump electrode BE. Each signal processing unit SP is arranged to process the received output signal.

Each signal processing unit SP includes a gate grounded circuit 31, a current mirror circuit 34, and a comparator 35. In the present embodiment, the gate grounded circuit 31 and the current mirror circuit 34 include an N-channel MOS FET (Metal-Oxide-Semiconductor Field Effect Transistor).

The gate grounded circuit 31 is provided between the through-electrode TE and the current mirror circuit 34 that correspond to each other. The gate grounded circuit 31 is electrically connected to the plurality of avalanche photodiodes APD of the corresponding pixel U through the corresponding through-electrode TE. A drain of the FET of the gate grounded circuit 31 is electrically connected in series with the corresponding bump electrode BE. The gate grounded circuit 31 is arranged to receive an output signal from the plurality of avalanche photodiodes APD of the corresponding pixel U through the corresponding through-electrode TE. A constant current source 32 is electrically connected to the drain in parallel with the bump electrode BE. A voltage source 33 is electrically connected to a gate of the FET included in the gate grounded circuit 31. An input terminal of the current mirror circuit 34 is electrically connected to a source of the FET included in the gate grounded circuit 31.

The current mirror circuit 34 is electrically connected to the gate grounded circuit 31. The output signal from the gate grounded circuit 31 is input to the current mirror circuit 34. The plurality of avalanche photodiodes APD are electrically connected to the current mirror circuit 34 through the corresponding through-electrode TE. The signal corresponding to the output signals of the plurality of avalanche photodiodes APD is input into the current mirror circuit 34. The current mirror circuit 34 is arranged to output a signal corresponding to the received output signals from the plurality of avalanche photodiodes APD.

The current mirror circuit 34 includes N-channel MOS FETs 34a and 34b paired with each other. An output terminal of the gate grounded circuit 31 is electrically connected to a drain of the FET 34a. The drain and a gate of the FET 34a are short-circuited. The gate of the FET 34a is electrically connected to a gate of an FET 34b. Sources of the FET 34a and the FET 34b are grounded. A drain of the FET 34b is electrically connected to an input terminal of the comparator 35 and of a resistor 34c. The resistor 34c is electrically connected to the drain of the FET 34b in parallel with the input terminal of the comparator 35. The resistor 34c includes an end portion electrically connected to the drain of the FET 34b and a grounded end portion.

The comparator 35 includes first and second input terminals and an output terminal. The first input terminal of the comparator 35 is electrically connected to the output terminal of the current mirror circuit 34 (the drain of the FET 34b). The output signal of the current mirror circuit 34 is input to the comparator 35. The second input terminal of the comparator 35 is electrically connected to a variable voltage source 36. A voltage source is electrically connected to a power supply terminal 35a of the comparator 35. The comparator 35 is arranged to output, from the output terminal, a digital signal corresponding to the output signals from the plurality of avalanche photodiodes APD of one pixel U.

Figure 7:
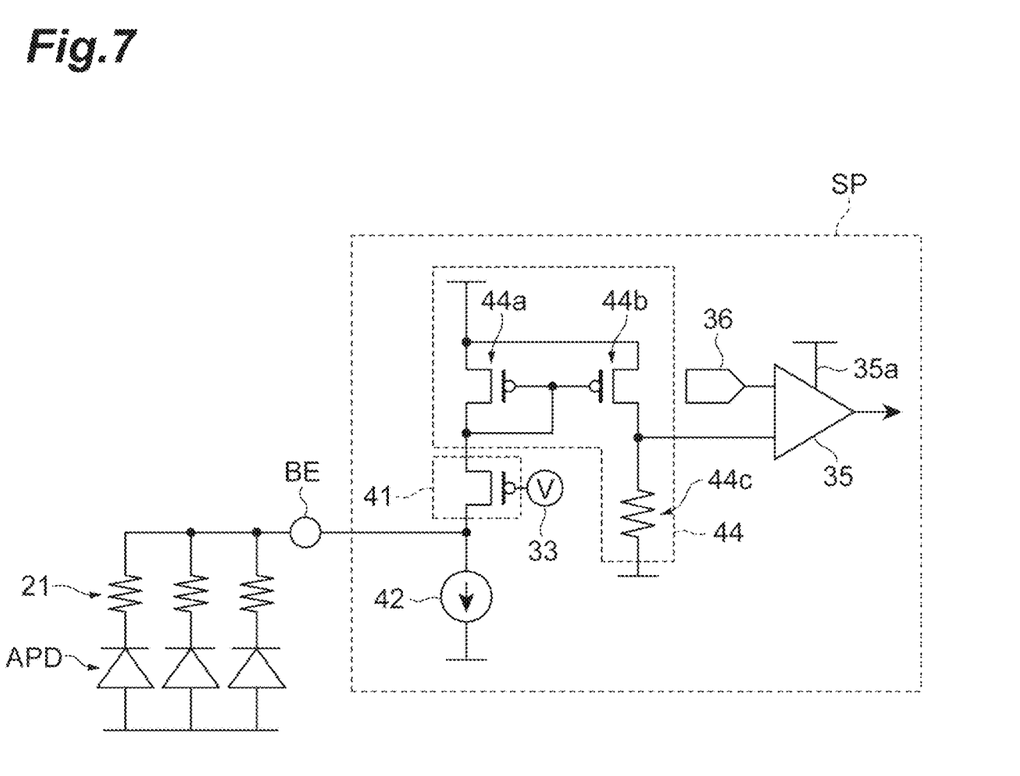
FIG. 7 is a circuit diagram illustrating a photodetecting device according to a modification of the present embodiment.

If the N type and the P type are replaced with each other in each avalanche photodiode APD, the signal processing unit SP may have the circuit configuration illustrated in FIG. 7. In which case, the polarities of the avalanche photodiode APD are inverted with respect to the through-electrode TE. The signal processing unit SP has a current mirror circuit 44 instead of the current mirror circuit 34. The current mirror circuit 44 includes P-channel MOS FETs 44a and 44b paired with each other. The signal processing unit SP includes a gate grounded circuit 41 instead of the gate grounded circuit 31. The gate grounded circuit 41 includes a P-channel MOS FET.

A drain of the FET included in the gate grounded circuit 41 is electrically connected in series with the corresponding bump electrode BE. The gate grounded circuit 41 is electrically connected to the plurality of avalanche photodiodes APD of the corresponding pixel U through the corresponding through-electrode TE. The gate grounded circuit 41 is arranged to receive the output signals from the plural avalanche photodiodes APD of the corresponding pixel U through the corresponding through-electrode TE. The drain is electrically connected to a constant current source 42 in parallel with the bump electrode BE. The constant current source 42 and the constant current source 32 have opposite current directions. A voltage source 33 is electrically connected to a gate of the FET included in the gate grounded circuit 41. An input terminal of the current mirror circuit 44 is electrically connected to a source of the FET included in the gate grounded circuit 41.

The current mirror circuit 44 is electrically connected to the gate grounded circuit 41. The output signal from the gate grounded circuit 41 is input to the current mirror circuit 44. The plurality of avalanche photodiodes APD are electrically connected to the current mirror circuit 44 through the corresponding through-electrode TE. The signal corresponding to the output signals from the plurality of avalanche photodiodes APD is input into the current mirror circuit 44. The current mirror circuit 44 is arranged to output a signal corresponding to the output signals from the input of the plurality of avalanche photodiodes APD.

The output terminal of the gate grounded circuit 41 is electrically connected to a drain of the FET 44a. The drain and a gate of the FET 44a are short-circuited. The gate of the FET 44a is electrically connected to a gate of the FET 44b. Sources of the FET 44a and the FET 44b are grounding. A drain of the FET 44b is electrically connected to a resistor 44c and the input terminal of the comparator 35. The resistor 44c is electrically connected to the drain of the FET 44b in parallel with the input terminal of the comparator 35. The resistor 44c includes an end portion electrically connected to the drain of the FET 44b and a grounded end portion.

The operation of photodetecting device 1 according to the present embodiment will be described with reference to FIG. 6.

In the semiconductor photodetecting element 10, each avalanche photodiode APD is arranged to operate in Geiger mode. In Geiger mode, a reverse voltage (reverse bias voltage) larger than the breakdown voltage of the avalanche photodiode APD is applied between the anode and the cathode of the avalanche photodiode APD. In the present embodiment, the anode is the first semiconductor region PA and the cathode is the second semiconductor region NA. The second semiconductor region NA is electrically connected to an electrode (not illustrated) provided on the back side of the semiconductor substrate 50. The first semiconductor region PA is electrically connected to the electrode E1 through the third semiconductor region PB. For example, a negative potential is applied to the first semiconductor region PA and a positive potential is applied to the second semiconductor region NA. The polarities of these potentials are relative to each other.

When light (photon) is incident upon the avalanche photodiode APD, photoelectric conversion is performed inside of the semiconductor substrate and photoelectrons are generated. At a region near the PN junction interface of the first semiconductor area PA, avalanche multiplication is performed, and the amplified electrons flow to the mount substrate 20 through the electrode E1, the quenching resistor 21, the electrode E2, the electrode E3, the through-electrode TE, and the bump electrode BE. When light (photon) is incident on any light receiving region S of the semiconductor photodetecting element 10, photoelectrons generated are multiplied, and a signal generated by the multiplied photoelectrons is retrieved through the bump electrode BE, and input into the corresponding signal processing unit SP. The signal processing unit SP outputs, from the output terminal, a digital pulse signal corresponding to the input signal.

As described above, in the photodetecting device 1, each signal processing unit SP includes the gate grounded circuit 31, 41 and the current mirror circuit 34, 44. The gate grounded circuit 31, 41 is electrically connected to the plurality of avalanche photodiodes APD included in the corresponding pixel U. The current mirror circuit 34, 44 is electrically connected to the respective gate grounded circuit 31, 41, and output the signal corresponding to the output signals from the plurality of avalanche photodiodes APD.

The input impedance of the gate grounded circuit 31, 41 is lower than an input impedance of a read circuit other than the gate grounded circuit. Therefore, the gate grounded circuit 31, 41 accurately transmits a steepness of a rise of the output signal from each avalanche photodiode APD arranged to operate in Geiger mode to the current mirror circuit 34, 44. The current mirror circuit 34, 44 has a low power consumption, have a high response speed, and accurately transmit information about the input signal, as compared with the operational amplifier circuit. The information about the input signal includes, for example, signal waveform. Therefore, each signal processing unit SP more accurately transmits the steepness of the rise of the output signal from the avalanche photodiode APD with low power consumption. As a result, the photodetecting device 1 includes the one-dimensionally distributed plurality of pixels U, and detects weak light with high accuracy and low power consumption. In the photodetecting device 1, each pixel U includes the plurality of avalanche photodiodes APD arranged to operate in Geiger mode. The plurality of avalanche photodiodes APD arranged to operate in Geiger mode are electrically connected to the current mirror circuit 34, 44. Therefore, in the photodetecting device 1, an increase in the power consumption is suppressed, and the photodetecting device 1 has high frequency characteristics. Furthermore, the photodetecting device 1 achieves both of improvement of photodetecting characteristics (photosensitivity, time resolution, spatial resolution) and a high dynamic range. Since each pixel U includes the plurality of avalanche photodiodes APD arranged to operate in Geiger mode in the photodetecting device 1, the photodetecting device 1 has the dynamic range. That is, the photodetecting device 1 identifies the plurality of photons based on the signal output from the pixel U. In contrast, a photodetecting device in which each pixel U includes only one avalanche photodiode APD, that is, a photodetecting device in which each pixel U includes a Single Photon Avalanche Diode (SPAD) does not have a dynamic range. The high degree of accuracy means, for example, that a weak signal with a high S/N is detected and that the time resolution is high.

Each signal processing unit SP has a comparator 35. The comparator 35 is arranged to receive the output signal from the current mirror circuit 34, 44. Therefore, each signal processing unit SP detects a signal having a desired pulse wave height from the signals input into the comparator 35. The comparator 35 appropriately removes noise such as, for example, dark count and the like. In the present embodiment, the variable voltage source 36 is connected to the second input terminal of the comparator 35. The variable voltage source 36 appropriately controls the voltage applied to the second input terminal. Therefore, in the signal processing unit SP, even when the pulse wave height of noise varies according to ambient light, the intended signal is detected. The intended signal has a peak value that exceeds the wave height of the noise.

The photodetecting device 1 includes a mount substrate 20 (circuit board) separated from the semiconductor substrate 50. The plurality of signal processing units SP are arranged on the mount substrate 20. When the semiconductor substrate 50 and the mount substrate 20 are separated, the semiconductor substrate 50 and the mount substrate 20 can be manufactured according to processes suitable therefor. Therefore, in the present embodiment, improvement of both characteristics and yield of each of the substrates 20 and 50 are achieved.

The plurality of avalanche photodiodes APD are electrically connected to the signal processing unit SP provided on the mount substrate 20 via the through-electrode TE. Therefore, the photodetecting device 1 achieves a low parasitic inductance, a low parasitic capacitance, and a high responsivity, as compared with a configuration in which a plurality of avalanche photodiodes are electrically connected to a signal processing unit via a bonding wire.

The semiconductor photodetecting element 10 includes a plurality of avalanche photodiodes APD arranged to operate in Geiger mode for each of the one-dimensionally distributed pixels U. Since the avalanche photodiode APD has an internal multiplication function, the weak light such as a single photon is detected even if the light receiving region of pixel U is relatively small. Therefore, in the present embodiment, the semiconductor photodetecting element 10 including the pixels U having the small light receiving region is realized. In the semiconductor photodetecting element 10, the plurality of pixels U are one-dimensionally distributed in the single semiconductor substrate 50, and the pitch WU of the pixels U is 10 to 500 μm. That is, in the semiconductor photodetecting element 10, since the plurality of pixels U having small light receiving regions are arranged with a narrow pitch, the semiconductor photodetecting element 10 (the photodetecting device 1) tends not to receive background light. In the photodetecting device 1, the proportion of the amount of the received background light to the amount of the received weak light of the detection target is small. Therefore, the background light component per pixel U is small. The background light is noise for the weak light.

When the pitch WU between the pixels U arranged in the semiconductor substrate 50 is large, the breakdown voltage required to operate the avalanche photodiode APD in Geiger mode tends to vary among the pixels U, as compared with when the pitch WU is small. The following problem may occur when the breakdown voltage required for the avalanche photodiode APD varies among the pixels U. When a uniform voltage is applied to each pixel U, the gains of the avalanche photodiodes APD are different among the pixels U. Therefore, the characteristics such as detection efficiency and dark count rate are different among the pixels U.

In the photodetecting device 1, since the pitch WU between the pixels U is relatively small, the variation in the breakdown voltages among the pixels U are small. Therefore, even when a uniform voltage is applied to each pixel U, the variation in the gains of avalanche photodiodes APD among the pixels U is small. That is, since characteristics such as breakdown voltage and dark count rate are homogeneous among the pixels U, in the photodetecting device 1, detection efficiency of weak light in the one-dimensionally distributed plurality of pixels U is homogeneous.

The photodetecting device 1 has a small area where the pixels are arranged, as compared with a photodetecting device of the following comparison target, so it is difficult for the photodetecting device 1 to receive the background light, and the photodetecting device 1 has less variation in the breakdown voltages. In the photodetecting device of the comparison target, a plurality of pixels are two-dimensionally distributed, and the width in the Y axis direction in the area where the plurality of pixels are arranged is the same as the width in the photodetecting device 1. When the photodetecting device 1 scans, for example, in a direction (X axis direction) perpendicular to the direction in which the plurality of pixels U are one-dimensionally distributed, accordingly, the photodetecting device 1 has a detection range similar to that of the photodetecting device of the comparison target described above. Therefore, the photodetecting device 1 can detect the weak light with high accuracy in a detection range similar to that of the photodetecting device where pixels are two-dimensionally distributed.

In the semiconductor substrate 50, a trench 13 is formed to surround the entire circumference of each light receiving region S when viewed from the Z axis direction. Therefore, interference between adjacent avalanche photodiodes APD is prevented. In avalanche photodiodes arranged to operate in Geiger mode, for example, light emission may occur due to carrier recombination that ensues following avalanche multiplication. The avalanche photodiode APD may receive the light emitted by an adjacent avalanche photodiode APD. In photodetecting device 1, the trench 13 prevents the light emitted by the avalanche photodiode APD from being transmitted to the adjacent avalanche photodiode APD.

Although the preferred embodiments and modifications of the present invention have been described above, the present invention is not necessarily limited to the above-described embodiments and modifications, and various modifications can be made without departing from the gist thereof.

Figure 8:
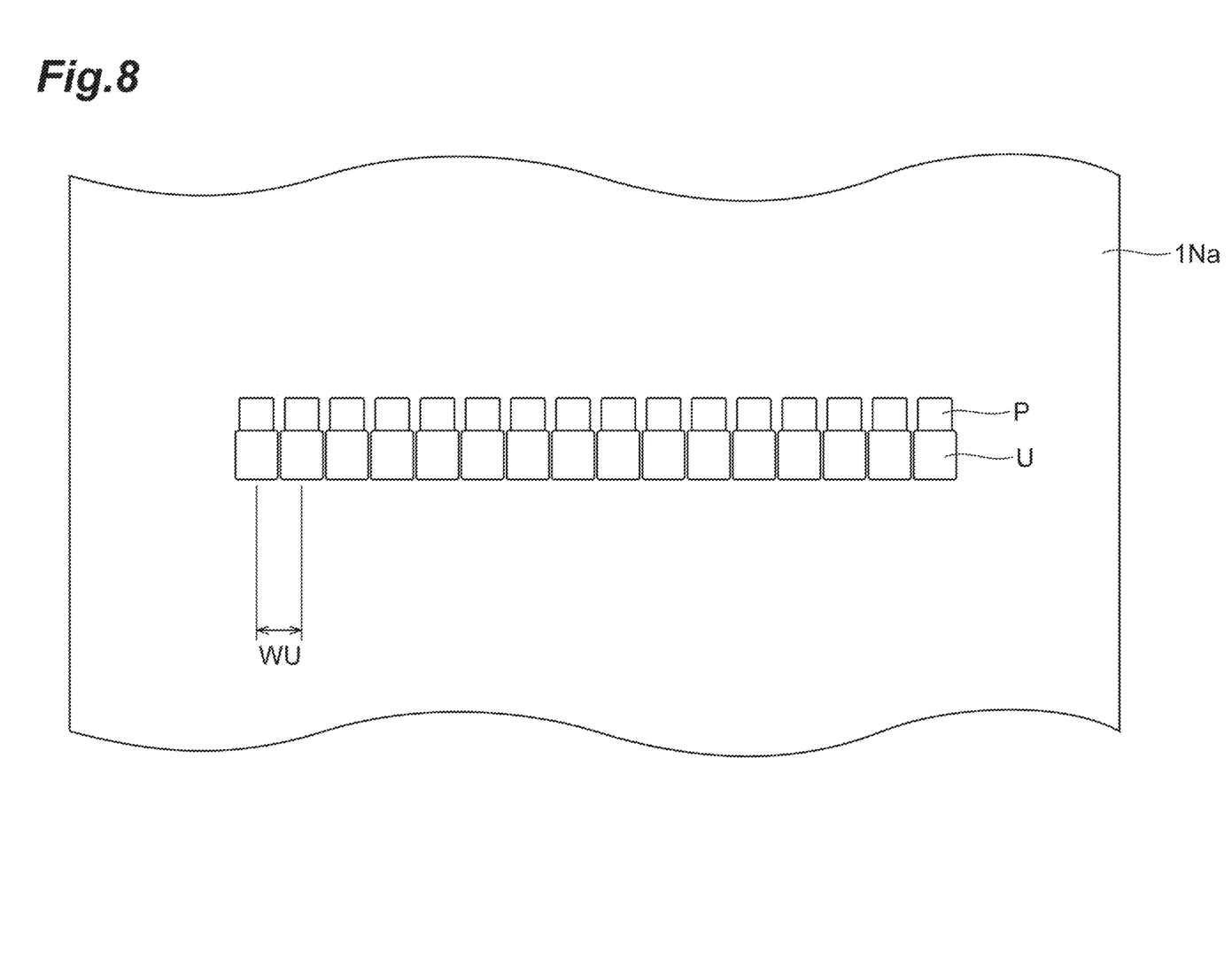
FIG. 8 is a schematic plan view illustrating a semiconductor photodetecting element according to a modification of the present embodiment.

In the above-described embodiment, the through-electrodes TE are arranged on the semiconductor substrate 50, and the plurality of avalanche photodiodes APD are electrically connected to the signal processing unit SP arranged on the mount substrate 20 via the through-electrode TE. The plurality of avalanche photodiodes APD may be electrically connected to the corresponding signal processing unit SP via a bonding wire instead of the through-electrode TE. In which case, as illustrated in FIG. 8, the bonding pads P are provided, instead of the through-electrodes TE, on the principal surface 1Na side of the semiconductor substrate 50. The pitch WU between the plurality of pixels U is 100 to 500 μm as shown in FIG. 8.

Figure 9:
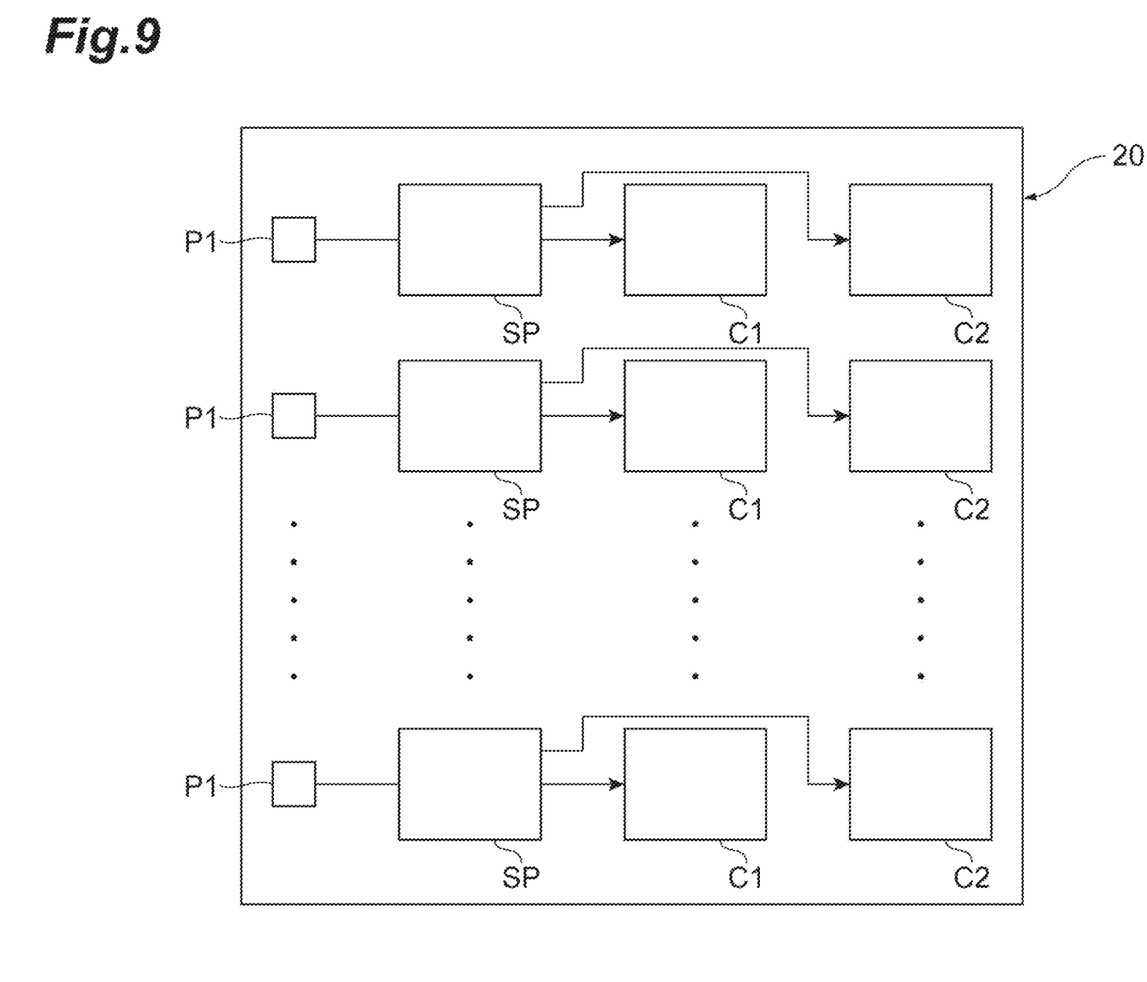
FIG. 9 is a diagram illustrating an example of a configuration of a mount substrate.

The photodetecting device 1 may include a first circuit C1 and a second circuit C2 for each signal processing unit SP as illustrated in FIG. 9. The first circuit C1 and the second circuit C2 are electrically connected to the corresponding signal processing unit SP. The photodetecting device 1 includes the plurality of first circuits C1 and the plurality of second circuits C2. The plurality of first circuits C1 and the plurality of second circuits C2 are disposed, for example, on the mount substrate 20. The mount substrate 20 includes a plurality of bonding pads P1 wire-bonded to the corresponding bonding pad P. The plurality of bonding pads P1 is electrically connected to the corresponding signal processing unit SP. Each first circuit C1 records an intensity (magnitude) of the output signal (current signal) from the signal processing unit SP (current mirror circuit 34, 44). That is, the first circuit C1 records a magnitude (height) of the signal output from the corresponding pixel U. Each first circuit C1 includes, for example, a charge pump. Each second circuit C2 records a time when the signal is output from the signal processing unit SP based on the output signal from the signal processing unit SP (comparator 35). That is, the second circuit C2 records the time when the light is incident upon the corresponding pixel U and the signal is output from the pixel U. Each second circuit C2 includes a time-digital converter (TDC). The mount substrate 20 illustrated in FIG. 9 is included in, for example, the photodetecting device 1 applied to the LiDar.

The photodetecting device 1 has the dynamic range, as described above. That is, even in a case in which a plurality of photons is incident upon in a single event, the number of incident photons is identified by the signal output from the pixel U. Therefore, the photodetecting device 1 can discriminate background light and signal light. Furthermore, the photodetecting device 1 can correct the time walk. The time walk is the following phenomenon. A waveform of the signal output from the pixel U, that is, a waveform of the signal received by the signal processing unit SP changes according to the height (magnitude) of the signal. In a case in which the signal received by the signal processing unit SP is compared with a predetermined threshold (wave height), when the height of the signal is high, a time needed until the height reaches the predetermined threshold (referred to as "reaching time" below) is short, as compared with when the height of the signal is small. That is, the reaching time varies due to the height of the signal. This phenomenon is referred to as the time walk. The larger the number of photons incident upon the pixel U in one event is, the higher the height of the signal output from the pixel U is. Therefore, since the photodetecting device 1 identifies the number of incident photons for each event, the reaching time can be corrected based on the number of photons, that is, the time walk can be corrected. In which case, the time resolution of the photodetecting device 1 is improved.

The plurality of signal processing units SP may be provided on the semiconductor substrate 50. For example, when the through-electrode TE is not used to electrically connect the pixel U (the plurality of avalanche photodiodes APD) and the signal processing unit SP that correspond to each other, the plurality of signal processing units SP may be provided on the semiconductor substrate 50 including the plurality of pixels U arranged therein, or may be provided on a circuit board separated from the semiconductor substrate 50. When the plurality of signal processing units SP are provided on the semiconductor substrate 50, manufacturing processes of the photodetecting device 1 is reduced, and the productivity of the photodetecting device 1 is improved. When the plurality of signal processing units SP are provided on a circuit board separated from the semiconductor substrate 50, the substrates can be manufactured according to processes suitable therefor as described above. In which case, both the improvement of the characteristics and the yield of the substrates are achieved. In a case in which the plurality of signal processing units SP is provided on the semiconductor substrate 50, the plurality of first circuits C1 and the plurality of second circuits C1 may be also provided on the semiconductor substrate 50.

For example, the photodetecting device 1 includes the comparator 35, but the present embodiment is not limited thereto. The photodetecting device 1 may include an inverter instead of the comparator 35. In which case, the output signal from the current mirror circuit 34, 44 is input into the inverter. When the photodetecting device 1 includes the inverter, photodetecting device 1 (the signal processing unit SP) detects the desired signal from which noise less than the fixed pulse wave height have been removed.

The gate grounded circuit 31, 41 may have any one of the N-channel MOS FET and the P-channel MOS FET.

The sizes of the FETs 34a and 34b of the current mirror circuit 34 may be different from each other. The sizes of the FETs 44a and 44b of the current mirror circuit 44 may be different from each other. When the sizes of the FETs 34a, 34b, 44a, 44b paired with each other are different, the steepness of the rise of the output signal from each avalanche photodiode APD is maintained and the output can be amplified. The size of the FET means the gate length.

In the above-described embodiment, the trench 13 is formed in the semiconductor substrate 50 for each light receiving region S. A part of the trench 13 may be shared between adjacent light receiving regions S. In the semiconductor substrate 50, the trench 13 may not be formed. The quenching resistor 21, the electrode pad 12, and the electrodes E2 and E3 may be covered with a single insulation layer. The electrodes E2 may be directly connected to the electrode pad 12. The insulation layer L2 may not be arranged in the through-hole TH. In which case, the through-electrode TE may have a columnar shape or a frustum shape.

In the above-described embodiment, one layer structure of the avalanche photodiode APD is illustrated, but the layer structure of the avalanche photodiode APD is not limited thereto. For example, the first semiconductor region PA and the third semiconductor region PB may have different conductivity types. In which case, a PN junction is formed by the first semiconductor region PA and the third semiconductor region PB. For example, the second semiconductor region NA may be made of a plurality of semiconductor regions having mutually different impurity concentrations. For example, the avalanche photodiode APD may include a semiconductor region of a first conductivity type (for example, P-type), and a semiconductor region of a second conductivity type (for example N-type) that is located in the semiconductor region of the first conductivity type and that forms a pn junction with the semiconductor region of the first conductivity type. In this configuration, the semiconductor region of the second conductivity type is the light receiving region.

INDUSTRIAL APPLICABILITY

The present invention can be used for a photodetecting device to detect weak light.

1 photodetecting device
10 semiconductor photodetecting element
20 mount substrate
21 quenching resistor
31, 41 gate grounded circuit
34, 44 current mirror circuit
35 comparator
50 semiconductor substrate
1Na, 1Nb, 20a principal surface
APD avalanche photodiode
S light receiving region
U pixel
TE through-electrode
SP signal processing unit.

The invention claimed is:

1. A photodetecting device comprising:
a semiconductor substrate having a first principal surface and a second principal surface opposing each other and including a plurality of pixels one-dimensionally distributed on a single line without other pixels being two-dimensionally distributed adjacent to the plurality of pixels one-dimensionally distributed,
wherein, for each of the pixels, the photodetecting device includes:
a plurality of avalanche photodiodes including light receiving regions provided in the first principal surface side of the semiconductor substrate, and arranged to operate in Geiger mode;
a plurality of quenching resistors provided on the first principal surface side of the semiconductor substrate, and electrically connected in series with the respective avalanche photodiodes; and
a signal processing unit arranged to process output signals from the plurality of avalanche photodiodes,
wherein the light receiving regions of the plurality of avalanche photodiodes are two-dimensionally distributed for each of the pixels, and
each of the signal processing units includes:
a gate grounded circuit electrically connected to the plurality of avalanche photodiodes of the corresponding pixel via the plurality of quenching resistors; and
a current mirror circuit electrically connected to a corresponding gate grounded circuit and arranged to output a signal corresponding to the output signals from the plurality of avalanche photodiodes.

2. The photodetecting device according to claim 1, wherein each of the signal processing units includes a comparator receiving an output signal from the current mirror circuit.

3. The photodetecting device according to claim 1, comprising a circuit board that is a different structural element than the semiconductor substrate,
wherein the signal processing unit is provided on the circuit board.

4. The photodetecting device according to claim 3, comprising a semiconductor photodetecting element including the semiconductor substrate,
wherein the semiconductor photodetecting element is mounted on the circuit board such that the second principal surface and the circuit board oppose each other, and includes a through-electrode penetrating through the semiconductor substrate in a thickness direction for each of the pixels,
the through-electrode is electrically connected to the respective plurality of quenching resistors, and
the gate grounded circuit of each of the signal processing units is electrically connected to the plurality of avalanche photodiodes via a corresponding through-electrode.

5. A photodetecting device comprising:
a semiconductor substrate having a first principal surface and a second principal surface opposing each other and consisting of a plurality of pixels one-dimensionally distributed on a single line,
wherein, for each of the pixels, the photodetecting device includes:
a plurality of avalanche photodiodes including light receiving regions provided in the first principal surface side of the semiconductor substrate, and arranged to operate in Geiger mode;
a plurality of quenching resistors provided on the first principal surface side of the semiconductor substrate, and electrically connected in series with the respective avalanche photodiodes; and
a signal processing unit arranged to process output signals from the plurality of avalanche photodiodes,
wherein the light receiving regions of the plurality of avalanche photodiodes are two-dimensionally distributed for each of the pixels, and
each of the signal processing units includes:

a gate grounded circuit electrically connected to the plurality of avalanche photodiodes of the corresponding pixel via the plurality of quenching resistors; and a current mirror circuit electrically connected to a corresponding gate grounded circuit and arranged to output a signal corresponding to the output signals from the plurality of avalanche photodiodes.

\* \* \* \* \*